(12) United States Patent  
Saito et al.

(10) Patent No.: US 8,519,499 B2
(45) Date of Patent: Aug. 27, 2013

(54) SOLID-STATE IMAGE SENSOR AND METHOD OF MANUFACTURING THE SAME

(75) Inventors: Mariko Saito, Yokohama (JP); Ikuko Inoue, Yokohama (JP); Takeshi Yoshida, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 395 days.

(21) Appl. No.: 12/845,194

(22) Filed: Jul. 28, 2010

(65) Prior Publication Data

US 2011/0062540 A1    Mar. 17, 2011

(30) Foreign Application Priority Data

Sep. 11, 2009 (JP) ................. 2009-210917

(51) Int. Cl.
*H01L 29/00* (2006.01)

(52) U.S. Cl.
USPC ............ 257/423; 257/E31.128; 257/E31.001

(58) Field of Classification Search
USPC ....................... 257/432, E31.128, E31.001
See application file for complete search history.

(56) References Cited

U.S. PATENT DOCUMENTS

2007/0001100 A1* 1/2007 Hsu et al. ............ 250/214.1
2009/0200587 A1* 8/2009 Venezia et al. ........... 257/292
2010/0244287 A1* 9/2010 Hsu et al. ................ 257/797

FOREIGN PATENT DOCUMENTS

| JP | 2003-31785 | 1/2003 |
|---|---|---|
| JP | 2004-71790 | 3/2004 |
| JP | 2004-153015 | 5/2004 |
| JP | 2005-209677 | 8/2005 |
| JP | 2009-176949 A | 8/2009 |
| JP | 2010-287638 | 12/2010 |

OTHER PUBLICATIONS

Office Action issued Oct. 23, 2012 in Japanese Application No. 2009-210917 (With English Translation).
Chinese Office Action issued Feb. 16, 2012 in Patent Application No. 201010274502.5 with English Translation.
Office Action issued Nov. 15, 2011, in Japanese Patent Application no. 2009-210917 with English translation.

* cited by examiner

*Primary Examiner* — Matthew Reames
(74) *Attorney, Agent, or Firm* — Oblon, Spivak, McClelland, Maier & Neustadt, L.L.P.

(57) ABSTRACT

According to one embodiment, a solid-state image sensor includes a semiconductor substrate including a first surface on which light enters, and a second surface opposite to the first surface, a pixel region formed in the semiconductor substrate, and including a photoelectric conversion element which converts the incident light into an electrical signal, a peripheral region formed in the semiconductor substrate, and including a circuit which controls an operation of the element in the pixel region, a plurality of interconnects which are formed in a plurality of interlayer insulating films stacked on the second surface, and are connected to the circuit, and a support substrate formed on the stacked interlayer insulating films and the interconnects. An uppermost one of the interconnects formed in an uppermost one of the interlayer insulating films is buried in a first trench formed in the uppermost interlayer insulating film.

8 Claims, 10 Drawing Sheets

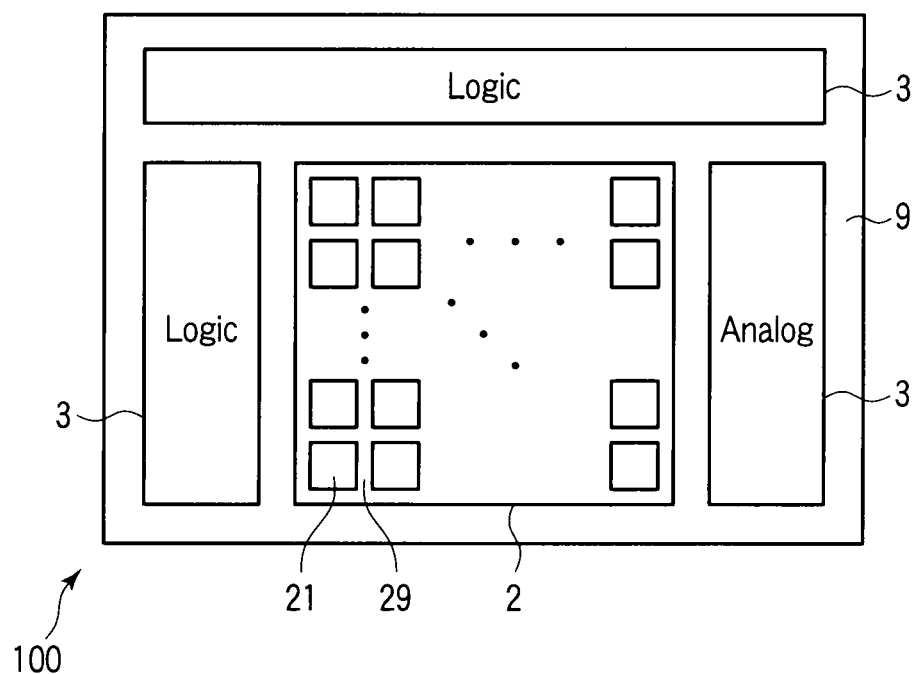
F I G. 1

SOLID-STATE IMAGE SENSOR AND METHOD OF MANUFACTURING THE SAME

CROSS-REFERENCE TO RELATED APPLICATIONS

This application is based upon and claims the benefit of priority from Japanese Patent Application No. 2009-210917, filed Sep. 11, 2009; the entire contents of which are incorporated herein by reference.

FIELD

Embodiments described herein relate generally to a solid-state image sensor and a method of manufacturing the same.

BACKGROUND

Recently, demands for solid-state image sensors (to be referred to as image sensors hereinafter) are increasing as digital cameras, cell phones with cameras, and the like have become popular.

An image sensor mainly includes a pixel region and peripheral region. Photoelectric conversion elements (e.g., photodiodes) for converting incident light into electrical signals are formed in the pixel region. Circuits for processing the signals from the pixel region and circuits for controlling the operation of the pixel region are formed in the peripheral region. These circuits are fabricated by using MOS (Metal-Oxide-Semiconductor) transistors and the like. The photodiodes and MOS transistors are formed on, e.g., the same semiconductor substrate.

In a front-illuminated image sensor, light enters from a surface on which the gate electrodes of the MOS transistors and interconnects are formed. This front-illuminated image sensor has the problem that as the degree of downsizing of the pixels (photoelectric conversion elements) increases, the sensitivity to light entering the pixel region decreases owing to the reduction in area of the pixel region or light shielding caused by the interconnects connected to the circuits.

To solve the problem of the front-illuminated image sensor as described above, a back-illuminated image sensor has been proposed. The back-illuminated image sensor receives incident light from a surface opposite to the surface on which the gate electrodes of the MOS transistors and the interconnects are formed. This avoids the decrease in sensitivity caused by the downsizing of the pixels and the light shielding by the interconnects.

In a conventional back-illuminated image sensor manufacturing method, after elements and interconnects are formed on a semiconductor substrate, a support substrate is adhered on an insulating film covering the elements and interconnects. After that, lenses and color filters are attached to a surface of the substrate, which is opposite to the support substrate.

In general, when using aluminum (Al) as interconnects, after the Al interconnects are formed on a lower interconnecting layer, an insulating film is deposited on the Al interconnects and between adjacent Al interconnects. In this case, even when the deposited insulating film undergoes a planarizing process, the upper surface of the insulating film cannot have high flatness owing to, e.g., junction portions (seams) of the insulating film. Consequently, when adhering the insulating film and support substrate of the back-illuminated image sensor, no high adhesion can be obtained between the insulating film and support substrate, and the support substrate peels off. This poses the problem that adhesion defects occur between the insulating film and support substrate.

BRIEF DESCRIPTION OF THE DRAWINGS

FIG. 1 is an exemplary view showing an example of the chip layout of a solid-state image sensor;

DETAILED DESCRIPTION

Figure 2:
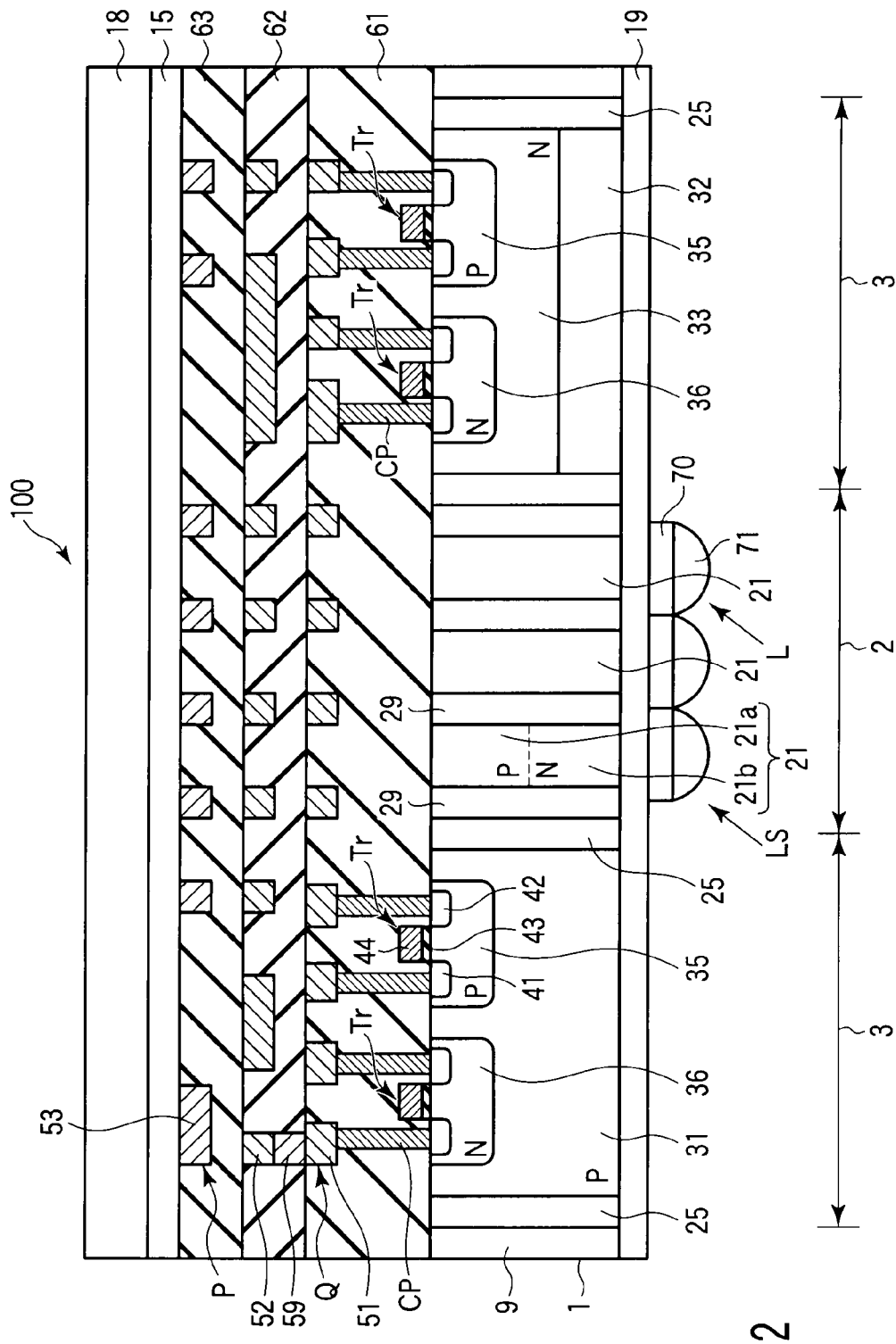
FIG. 2 is a sectional view showing the structure of a solid-state image sensor of the first embodiment.

Embodiments will be explained in detail below with reference to the accompanying drawing. Note that in the following embodiments, the same reference numerals denote the same constituent components, and a repetitive explanation will be made as needed.

In general, according to one embodiment, a solid-state image sensor includes a semiconductor substrate including a first surface on which light enters, and a second surface opposite to the first surface; a pixel region formed in the semiconductor substrate, and including a photoelectric conversion element which converts the incident light into an electrical signal; a peripheral region formed in the semiconductor substrate, and including a circuit which controls an operation of the element in the pixel region; a plurality of interconnects which are formed in a plurality of interlayer insulating films stacked on the second surface, and are connected to the circuit; and a support substrate formed on the stacked interlayer insulating films and the interconnects. An uppermost one of the interconnects formed in an uppermost one of the interlayer insulating films is buried in a first trench formed in the uppermost interlayer insulating film.

(1) First Embodiment

A solid-state image sensor and a method of manufacturing the same according to the first embodiment will be explained below with reference to FIGS. 1, 2, 3, 4, 5, 6, and 7.

(a) Structure

The structure of the solid-state image sensor according to this embodiment will be explained below with reference to FIGS. 1 and 2.

FIG. 1 is an exemplary view showing an example of the chip layout of the solid-state image sensor (to be referred to as an image sensor hereinafter). FIG. 2 is a sectional view exemplarily showing the structure of the image sensor of this embodiment.

In the image sensor of this embodiment as shown in FIG. 1, a pixel region 2 and peripheral regions 3 are formed in a chip (semiconductor substrate) 100. A dicing region 9 for cutting out a chip from one wafer is formed along the outer periphery of the chip 100 so as to surround the pixel region 2 and peripheral regions 3. For example, pads (not shown) for connecting to an external device (not shown) are formed on the front or back surface of the chip 100.

As shown in FIGS. 1 and 2, a plurality of photoelectric conversion elements 21 are two-dimensionally arranged in the pixel region 2. The photoelectric conversion elements 21 are photodiodes or the like. For example, a CMOS sensor is constructed by using the photodiodes 21. Note that a CCD sensor may be constructed by using the photodiodes 21. Each photodiode 21 photoelectrically converts incident light LS as an image signal into an electrical signal corresponding to the light amount. One photodiode 21 corresponds to one pixel of the image signal.

In this embodiment as shown in FIG. 2, color filters 70 are formed on a protective layer and adhesion layer (to be referred to as a protective/adhesion layer hereinafter) 19 on the pixel region 2 on the back surface (first surface) of the chip 1. The color filters 70 have a pattern obtained by arranging, in one-to-one correspondence with pixels, a plurality of filters each of which transmits only one of, e.g., red (R), green (G), and blue (B). Note that the color filters 70 can also include a white (W) filter that transmits the whole wavelength region of visible light, in addition to the red, green, and blue filters. The color filters 70 have an arrangement pattern such as a Bayer pattern or WRGB pattern.

A microlens array 71 is formed on the color filters 70 on the pixel region 2. The microlens array 71 is formed by two-dimensionally arranging microlenses each corresponding to one pixel (photodiode). The microlens array 71 condenses incident light. Note that the protective/adhesion layer 19 transmits incident light.

The incident light LS as an image signal illuminates the pixel region 2 through the microlenses 71 and color filters 70. In this embodiment, the surface on which the microlenses 71 are attached will be called the back surface, and the surface opposite to the back surface will be called the front surface.

The image sensor of this embodiment is formed by using, e.g., an SOI (Silicon-On-Insulator) substrate (to be also referred to as a formation substrate hereinafter). The photodiodes 21 are formed by using, e.g., an impurity semiconductor layer formed in an epitaxial layer 1 of the SOI substrate.

As shown in FIG. 2, each photodiode 21 includes, e.g., a p-type impurity layer 21a and n-type impurity layer 21b. The n-type impurity layer 21b is formed on the back surface side of the epitaxial layer 1. The p-type impurity layer 21a is formed in the surface layer of the epitaxial layer 1 on the front surface side. For the sake of simplicity, FIG. 2 shows a photodiode including two impurity layers. To improve the characteristic (sensitivity) of the photodiode 21, however, a plurality of n-type impurity layers and a plurality of p-type impurity layers having different impurity concentrations in the direction of depth may be formed in the epitaxial layer 1 in the pixel region 2.

As shown in FIGS. 1 and 2, each photodiode 21 is surrounded by an element isolation region 29 formed in the epitaxial layer 1, and electrically isolated from adjacent elements 21. In the photoelectric element isolation region 29, an element isolation insulating film (not shown) having, e.g., an STI (Shallow Trench Isolation) structure is formed on the front surface side of the element isolation region 29, and an impurity layer (e.g., a p-type impurity layer) is formed below (on the back surface side of) the element isolation insulating film having the STI structure. Note that although not shown in FIGS. 1 and 2, elements such as field effect transistors forming the sensor can of course be formed in the pixel region 2.

The peripheral regions 3 are formed adjacent to the pixel region 2 in the chip 100. The peripheral regions 3 are electrically isolated from the pixel region 2 by, e.g., an element isolation region 25. In the element isolation region 25, an element insulating film having the STI structure is buried on the front surface side of the region 25, and an impurity layer is formed below the insulating film, as in the photoelectric element isolation region 29.

The peripheral regions 3 include a region (to be referred to as an analog circuit region hereinafter) in which analog circuits are formed, and regions (to be referred to as logic regions hereinafter) in which logic circuits are formed. The circuits formed in the peripheral regions 3 are, e.g., circuits such as an analog/digital conversion circuit and a digital signal processor (DSP) for processing photoelectrically converted image signals, and circuits such as a row control circuit and column control circuit for controlling the elements in the pixel region.

These circuits are formed by field effect transistors, resistance elements, capacitance elements, and the like. For the sake of simplicity, FIG. 2 shows only MOS (Metal-Insulator-Semiconductor) field effect transistors (to be referred to as MOS transistors hereinafter).

For example, in the peripheral regions 3, MOS transistors Tr are formed in a p-type well region 31 in the epitaxial layer 1. A p-type well region 35 and n-type well region 36 are further formed in the p-type well region 31, thereby forming a double-well structure. The adjacent well regions 35 and 36 are electrically isolated by, e.g., an element isolation insulating film (not shown). Like an n-type well region 33, a well region can also be formed in a portion (surface layer) 32 of the epitaxial layer. Note that although FIG. 2 shows four MOS transistors Tr for the sake of simplicity, the number of MOS transistors Tr included in the image sensor of this embodiment is of course not limited to four.

Referring to FIG. 2, N-channel MOS transistors Tr are formed in the p-type well regions 35, and P-channel MOS transistors Tr are formed in the n-type well regions 36. The structure of the transistor Tr will be explained below by taking the N-channel MOS transistor Tr as an example.

Two n-type diffusion layers (impurity layers) 41 and 42 are formed in the p-type well region 35. The two diffusion layers 41 and 42 function as the source/drain of the transistor Tr. A gate electrode 44 is formed on a gate insulating film 43 on the surface of a well region (channel region) between the two diffusion layers 41 and 42. This forms the N-channel MOS transistor Tr in the p-type well region 35. The P-channel MOS transistor Tr has practically the same structure as that of the N-channel MOS transistor Tr, except for the conductivity type of the well region in which the transistor Tr is formed, and the conductivity type of the diffusion layers serving as the source/drain.

A plurality of interlayer insulating films (first, second, and third interlayer insulating films) 61, 62, and 63 are stacked on the surface of the epitaxial layer 1 so as to cover the gate electrodes 44 of the transistors Tr and the photodiodes 21. The interlayer insulating films 61, 62, and 63 are made of silicon oxide such as TEOS (TetraEthyl OrthoSilicate). Although FIG. 2 shows the three interlayer insulating films 61, 62, and

63, the number of layers is of course not limited to three. This embodiment will be explained by regarding the interlayer insulating film 63 as an uppermost interlayer insulating film. Note that in this embodiment, the uppermost interlayer insulating film is an interlayer insulating film positioned closest to a support substrate 18, among interlayer insulating films stacked on the chip surface (second surface) in order from the chip surface (epitaxial layer 1) toward the support substrate 18. The interlayer insulating film 61 in contact with the epitaxial layer 1 is a lowermost interlayer insulating film.

The multilevel interconnect technology is used in the image sensor of this embodiment. That is, a plurality of interconnects 51, 52, and 53 are respectively formed in the stacked interlayer insulating films 61, 62, and 63. The stacked interconnects 51, 52, and 53 are electrically connected by plugs 59 buried in the interlayer insulating films 61, 62, and 63. Note that the gate electrode 44 and diffusion layers 41 and 42 of the transistor Tr and the terminal of an element formed on the epitaxial layer 1 are connected to the interconnects 51 in the upper layer via plugs (not shown).

The plurality of interconnects 51, 52, and 53 are used to interconnect the plurality of elements Tr formed on the substrate, thereby forming a plurality of circuits from these elements. Also, the interconnects 51, 52, and 53 are connected to pads (not shown) or the like, and used to input and output signals, and supply the power supply voltage and ground voltage to the circuits and elements. The following description will be made by regarding the interconnects 53 formed in the uppermost interlayer insulating film 63 as uppermost interconnects 53.

The support substrate 18 is formed on a planarizing film, a protective film, and an adhesion layer 15 on the uppermost interlayer insulating film 63 and uppermost interconnects 53. This embodiment will be described by regarding that surface of the interlayer insulating film which faces the support substrate 18 is the upper surface, and that surface of the interlayer insulating film which faces the formation substrate 1 is the lower surface (bottom surface).

The surface (second surface) of the substrate (epitaxial layer 1) on which the interlayer insulating films 61, 62, and 63 and interconnects 51, 52, and 53 are formed is opposite to the surface (first surface) of the substrate 1 on which the color filters 70 and microlenses 71 are formed. In this embodiment, the surface on which the color filters 70 and microlenses 71 to be illuminated with incident light as an image signal are formed is called "the back surface", and the surface on which the interlayer insulating films 61, 62, and 63 and interconnects 51, 52, and 53 are formed will is called "the front surface".

An image sensor having the structure in which light enters from the surface opposite to the surface of the substrate on which the gate electrodes of the transistors Tr and the interconnects are formed as described above is called a back-illuminated image sensor.

In the image sensor of this embodiment, trenches P are formed in the uppermost interlayer insulating film 63. The uppermost interconnects 53 are formed in the trenches P in the uppermost interlayer insulating film 63. The upper surface level of the uppermost interconnects 53 is practically equal to that of the uppermost interlayer insulating film 63. In this embodiment, the upper surface levels of the interconnects and interlayer insulating films are values based on a dimension perpendicular to the surface of the substrate (epitaxial layer).

The uppermost interconnects 53 are formed in the uppermost interlayer insulating film 63 by using, e.g., the damascene method. This makes it possible to obtain the structure in which the upper surface level of the uppermost interconnects 53 and that of the uppermost interlayer insulating film 63 are practically equal. The uppermost interconnects 53 are made of, e.g., copper (Cu) or an alloy of Cu. The Cu interconnect 53 can decrease the interconnect resistance and suppress electromigration, compared to an aluminum (Al) interconnect.

In the interconnect formation technique using Al, for example, after an Al film deposited on an interlayer insulating film is processed into a predetermined interconnect shape, an interlayer insulating film covering the processed Al interconnect is formed. In a region between adjacent Al interconnects, therefore, the upper surface of the interlayer insulating film formed on the interconnect and on the lower interlayer insulating film cannot secure high flatness under the influence of a step difference between the Al interconnect upper surface and the underlayer (the upper surface of the lower interlayer insulating film) or the influence of a junction surface (seam) between the interlayer insulating films, even when a planarizing process is performed on the uppermost interlayer insulating film, e.g., even when a planarizing film is formed on the uppermost interlayer insulating film.

In a back-illuminated image sensor using Al interconnects, therefore, the adhesion between a support substrate and a surface on which the support substrate is adhered is low. Consequently, the support substrate peels off to cause adhesion defects of the support substrate.

In the image sensor of this embodiment, the uppermost interconnects 53 are formed by using, e.g., the damascene method in the trenches formed in the uppermost interlayer insulating film 63. Therefore, the upper surface levels of the uppermost interconnects 53 and uppermost interlayer insulating film 63 are practically equal, and the flatness of the surface on which the support substrate is to be adhered improves. This improves the adhesion between the support substrate and the surface on which the support substrate is adhered, and reduces adhesion defects of the support substrate.

Note that similar to the uppermost interconnects 53, the interconnects 51 and 52 formed below the uppermost interconnects 53 are preferably buried by the damascene method in trenches Q formed in the interlayer insulating films 61 and 62, and the upper surface levels of the interconnects 51 and 52 and interlayer insulating films 61 and 62 are preferably equal. This is so because the flatness of the lower interconnects 51 and 52 and interlayer insulating films 61 and 62 have an effect on the upper interconnects 53 and interlayer insulating film 63, so the flatness of the lower interconnects 51 and 52 and interlayer insulating films 61 and 62 is also desirably high. However, aluminum (Al) can also be used as the interconnects 51 and 52 formed below the uppermost interconnects 53, and the interconnects 51 and 52 need not be formed in the trenches Q in the interlayer insulating films 61 and 62.

Accordingly, the solid-state image sensor according to the first embodiment can improve the reliability of a solid-state image sensor, e.g., a back-illuminated image sensor.

(b) Manufacturing Method

A method of manufacturing the solid-state image sensor (back-illuminated image sensor) according to the first embodiment will be explained below with reference to FIGS. 2, 3, 4, 5, 6, and 7. FIGS. 2, 3, 4, 5, 6, and 7 illustrate the sectional structures in the steps of the manufacturing method of this embodiment.

Figure 3:
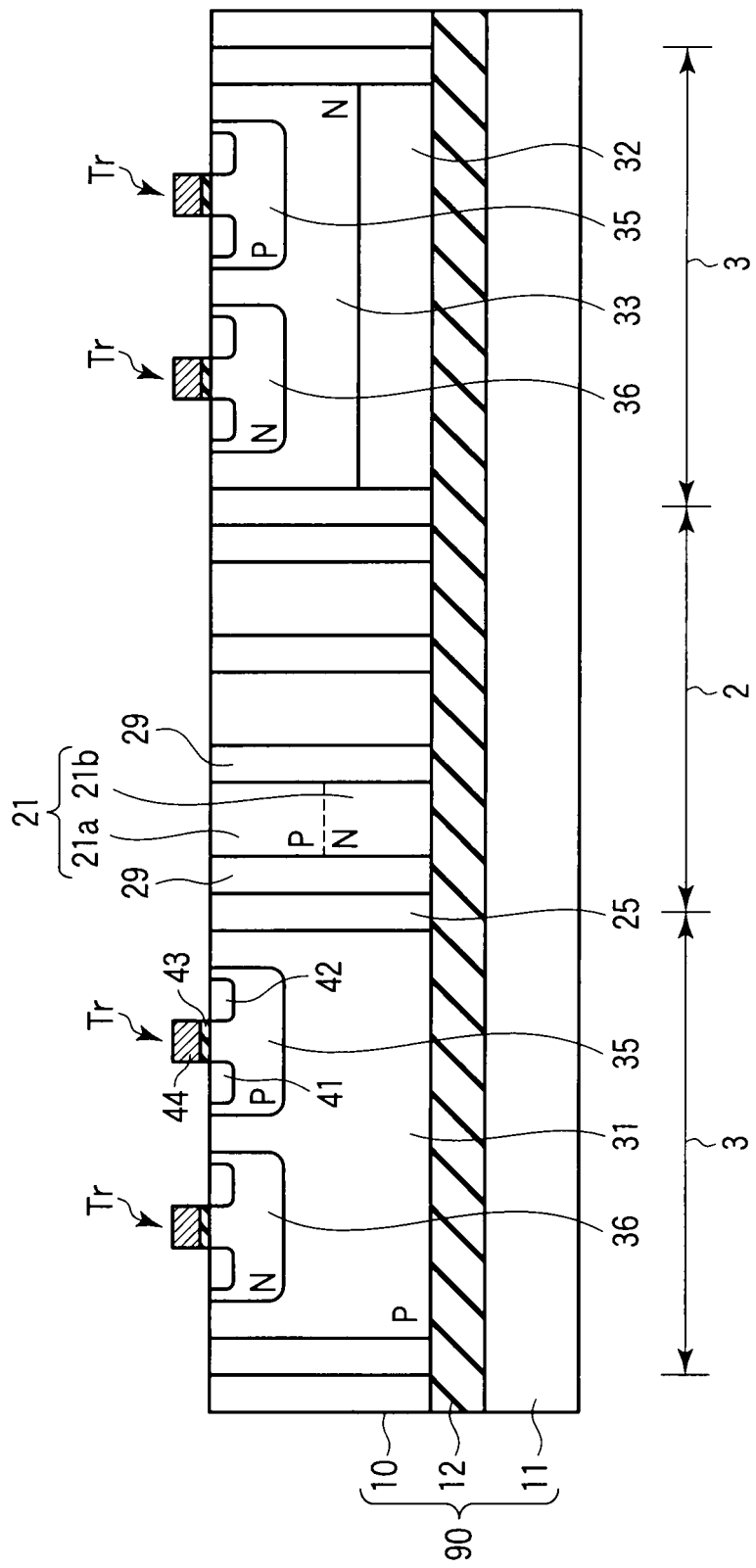
FIG. 3 is a sectional view showing one step of a method of manufacturing the solid-state image sensor of the first embodiment.

First, as shown in FIG. 3, impurity regions such as well regions 31, 35, and 36 and an element isolation region 29 are formed in an epitaxial layer 10 of an SOI substrate 90. Note that the SOI substrate is obtained by forming the epitaxial layer 10 on the upper surface of an insulating film (insulator)

12 on a semiconductor substrate 11. The epitaxial layer 10 is, e.g., an n- or p-type semiconductor layer or intrinsic semiconductor layer.

The well regions 31, 35, and 36 and impurity region 29 are formed in predetermined positions of the epitaxial layer 10 by using masks formed by the photolithography technique, and controlling the incidence speed of impurity ions. Consequently, a pixel region 2 and peripheral regions 3 adjacent to the pixel region 2 are formed in the epitaxial layer 10. In addition, element isolation regions (insulating films or impurity layers) for electrically isolating adjacent elements are formed in predetermined positions in the pixel region 2 and peripheral regions 3. The insulating films formed in the element isolation regions are, e.g., insulating films having the STI structure, and buried in trenches formed in the epitaxial layer 10.

In the pixel region 2, p-type and n-type impurity layers 21a and 21b are formed by ion implantation. Also, the element isolation region 29 is formed in the pixel region 2, thereby forming photodiodes 21 each corresponding to a pixel of the image sensor.

In the peripheral regions 3, MOS transistors Tr, resistance elements, and the like are formed in the formed well regions 35 and 36. The MOS transistors Tr are formed by, e.g., the following steps.

For example, a gate oxide film 43 is formed on the surfaces of the well regions 35 and 36 by using thermal oxidation. Then, a conductive layer is deposited on the surface of the epitaxial layer 10 by using, e.g., CVD (Chemical Vapor Deposition). The deposited conductive layer is processed by using photolithography and RIE (Reactive Ion Etching), thereby forming gate electrodes 44 of the MOS transistors Tr. After that, diffusion layers 41 and 42 to be used as the sources/drains of the MOS transistors Tr are formed in the well regions 35 and 36 by, e.g., ion implantation. When forming the diffusion layers 41 and 42, a region where no diffusion layers 41 and 42 are to be formed is covered with a resist mask or the like. When using polysilicon as the gate electrodes 44, a step of siliciding polysilicon may be included.

Note that it is possible to form the elements such as the MOS transistors Tr in the peripheral regions 3 after the photodiodes 21 are formed in the pixel region 2, or form the photodiodes 21 after the MOS transistors Tr are formed. Note also that the order of the step of forming the elements and the step of forming the element isolation region is not limited.

Figure 4:
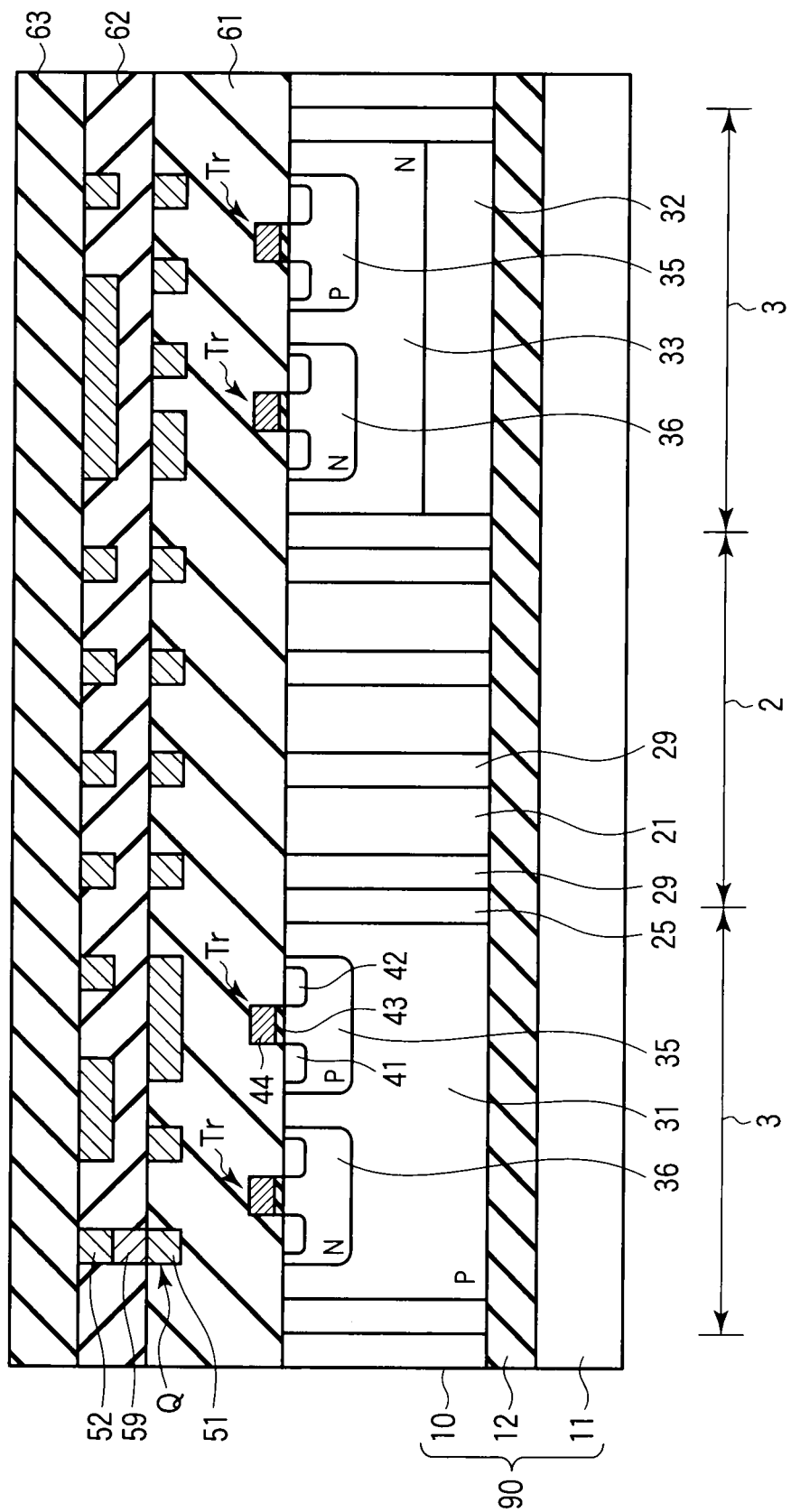
FIG. 4 is a sectional view showing another step of the method of manufacturing the solid-state image sensor of the first embodiment.

Then, as shown in FIG. 4, a first interlayer insulating film 61 is deposited by using, e.g., CVD, on the surface (second surface) of the substrate (epitaxial layer 10) on which the elements are formed. A plurality of first interconnects 51 are formed in the interlayer insulating film 61. The interconnects 51 are deposited on the insulating film 61 by using, e.g., sputtering. The interconnects 51 are buried by using, e.g., the damascene method in trenches Q formed in the interlayer insulating film 61. The trenches Q are formed in accordance with the layout of interconnects by using photolithography and RIE. When forming the interconnects 51 by the damascene method, copper (Cu) or the like is used as the material of the interconnects.

Note that it is also possible to deposit an interconnect material (e.g., aluminum (Al)) on the interlayer insulating film, and process the interconnect material into predetermined shapes by using photolithography and RIE, thereby forming the interconnects 51 on the interlayer insulating film 61.

Interconnects 52 and a second interlayer insulating film 62 are formed on the interlayer insulating film 61 by steps similar to the steps of forming the interconnects 51 and interlayer insulating film 61. In addition, in positions where the upper interconnects are to be connected to the lower interconnects or the terminals of the elements, plugs 59 are formed in the interlayer insulating films 61 and 62.

A third interlayer insulating film 63 is deposited on the second interlayer insulating film 62 by using, e.g., CVD. The manufacturing method of this embodiment will be described by regarding the third interlayer insulating film 63 as an uppermost interlayer insulating film. However, the number of interlayer insulating films 61 to 63 to be stacked is of course not limited to three.

A planarizing process is performed on the upper surface of the interlayer insulating film 63 by using, e.g., CMP (Chemical Mechanical Polishing).

Figure 5:
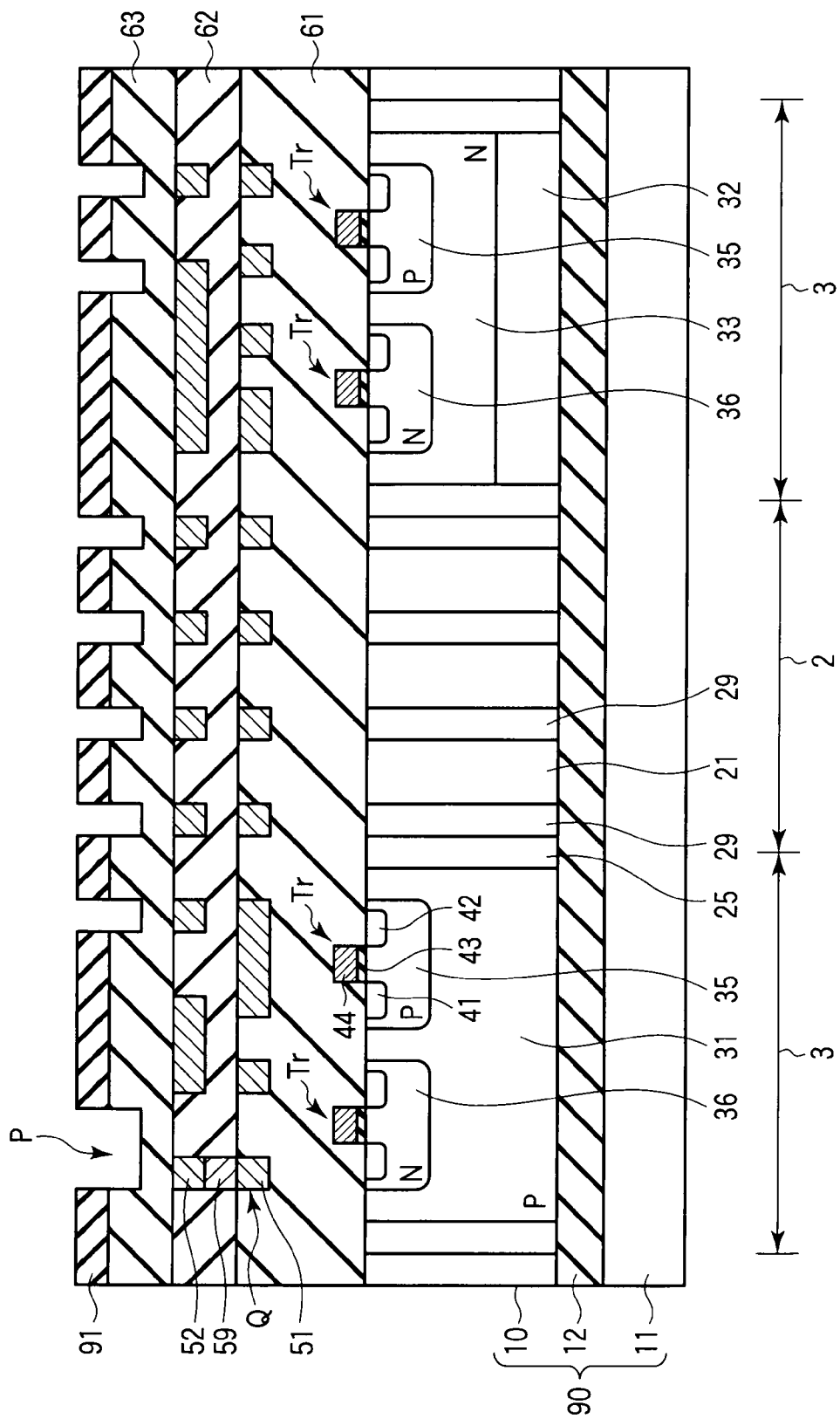
FIG. 5 is a sectional view showing still another step of the method of manufacturing the solid-state image sensor of the first embodiment.

Subsequently, as shown in FIG. 5, a mask (e.g., a resist mask) 91 is formed on the uppermost interlayer insulating film 63 by using photolithography. Trenches P are formed in the interlayer insulating film 63 based on the formed mask 91. The layout of the formed trenches P corresponds to that of interconnects to be formed in the interlayer insulating film 63.

Figure 6:
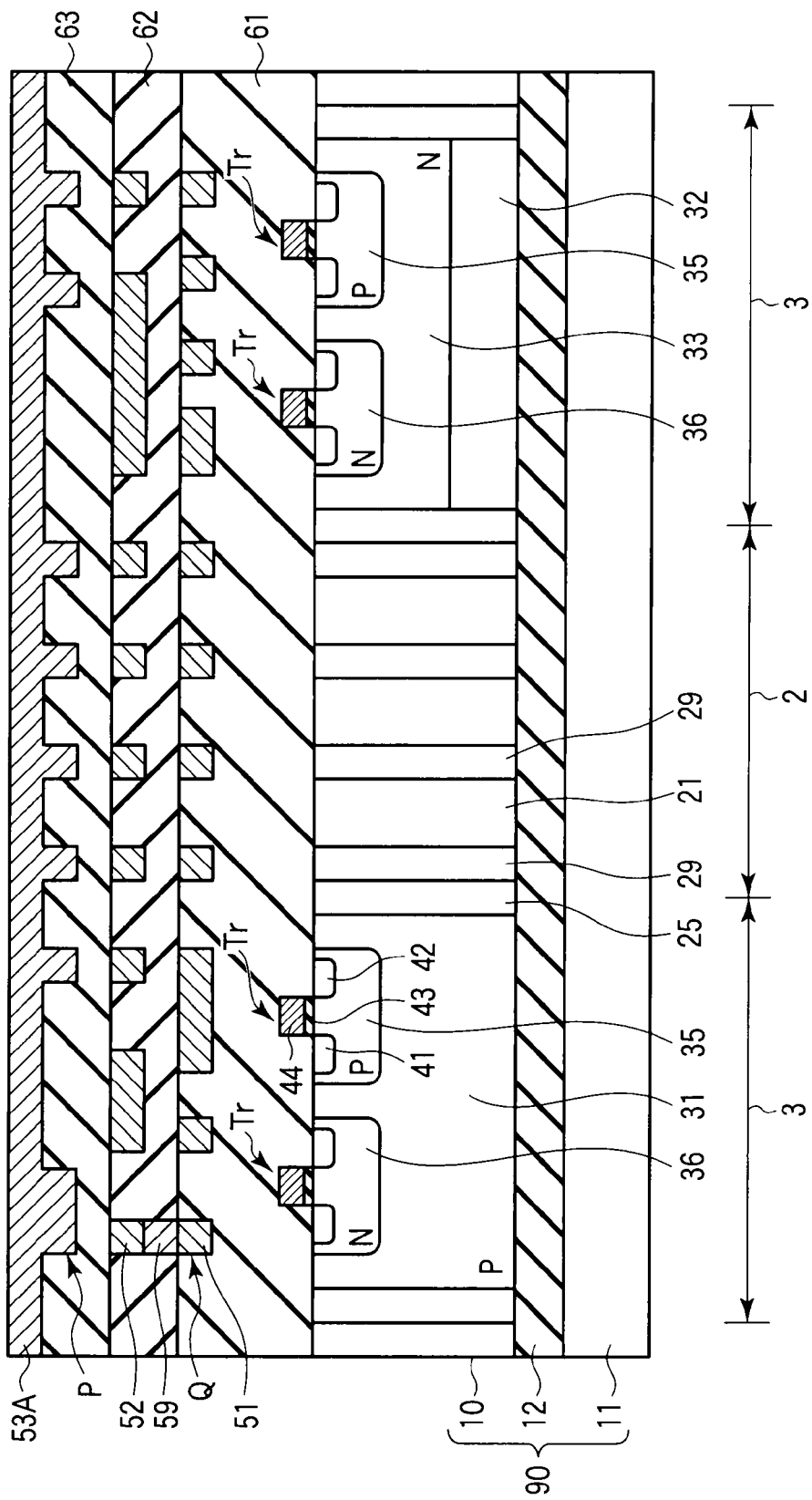
FIG. 6 is a sectional view showing still another step of the method of manufacturing the solid-state image sensor of the first embodiment.

After the mask 91 is removed from the upper surface of the interlayer insulating film 63, as shown in FIG. 6, an interconnect material 53A is deposited on the interlayer insulating film 63 by using, e.g., sputtering. The interconnect material 53A is, e.g., Cu or an alloy of Cu.

The interconnect material 53A is polished by performing CMP on its upper surface. This CMP for the interconnect material 53A is performed using the upper surface of the interlayer insulating film 63 as a stopper.

Figure 7:
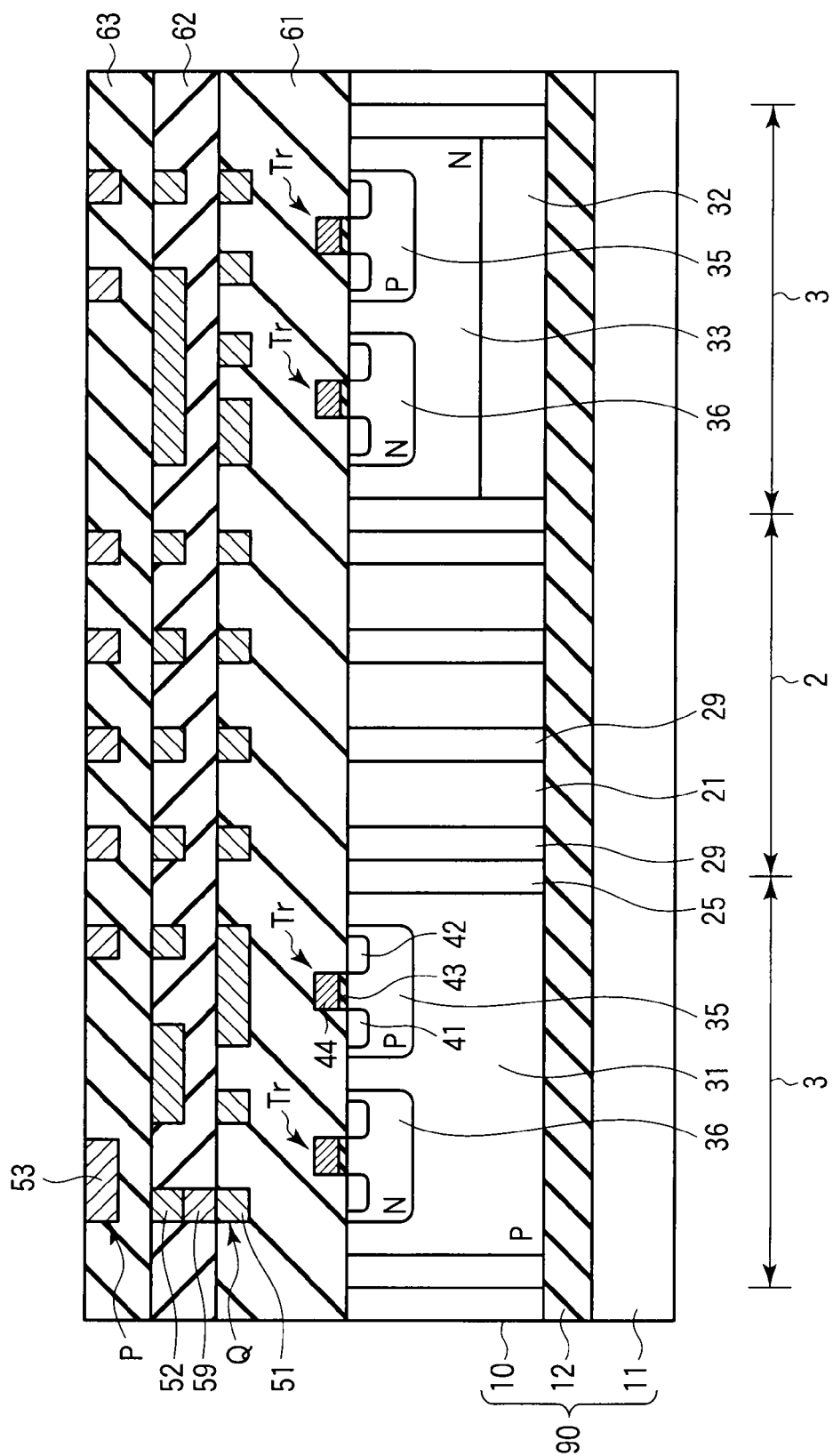
FIG. 7 is a sectional view showing still another step of the method of manufacturing the solid-state image sensor of the first embodiment.

Consequently, as shown in FIG. 7, interconnects 53 are buried by self-alignment in the trenches P formed in the interlayer insulating film 63. Thus, the interconnects 53 to be formed in the uppermost layer are formed in the uppermost interlayer insulating film 63 by using the damascene method. This makes the upper surface level of the interconnects 53 practically equal to that of the interlayer insulating film 63. That is, the upper surfaces of the interconnects 53 and the upper surface of the interlayer insulating film 63 are practically flat.

Figure 8:
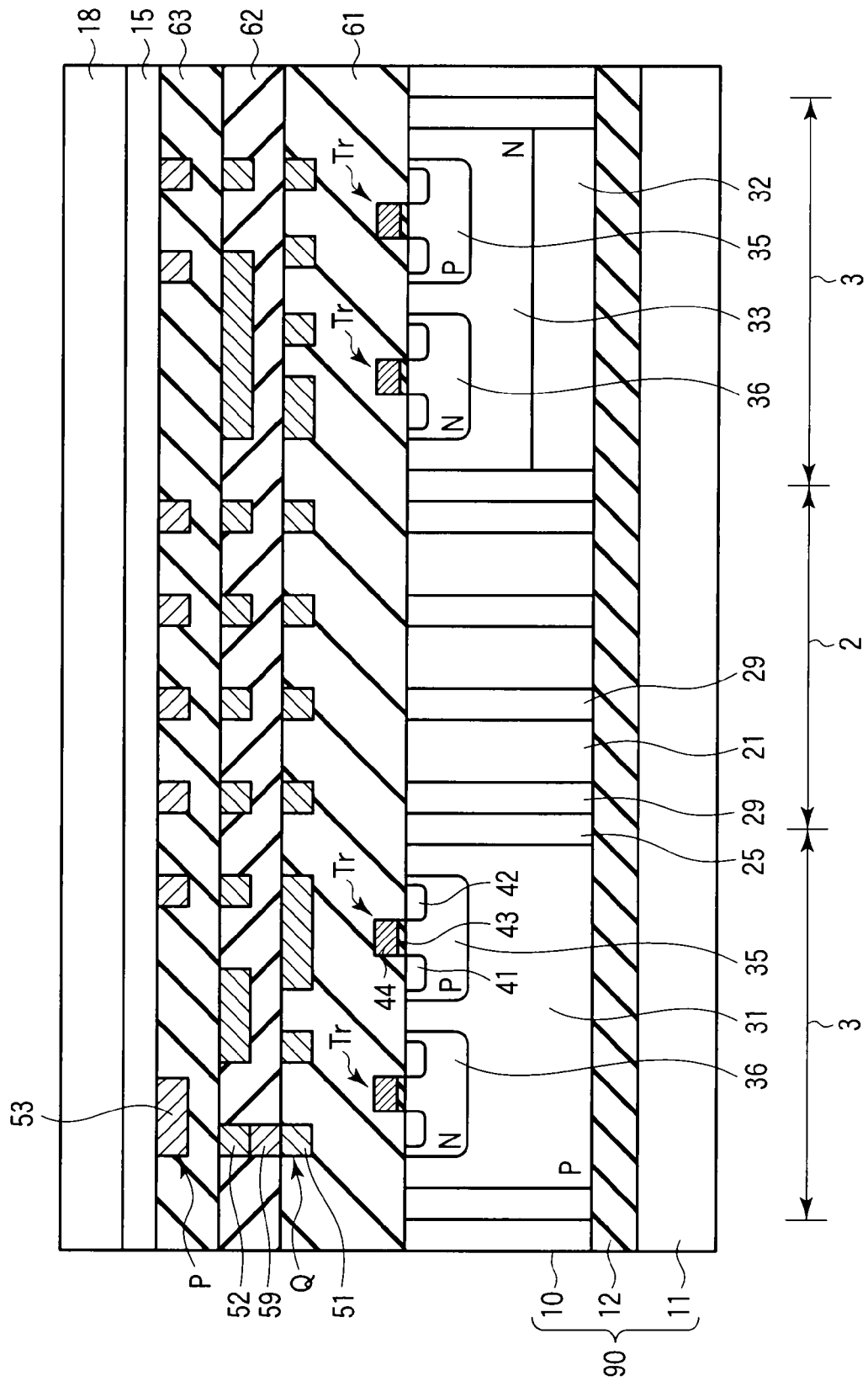
FIG. 8 is a sectional view showing still another step of the method of manufacturing the solid-state image sensor of the first embodiment.

After that, as shown in FIG. 8, a planarizing film, a protective film, and an adhesion layer 15 are formed on the upper surfaces of the uppermost interconnects 53 and interlayer insulating film 63. A support substrate 18 is adhered to the adhesion layer 15 on the upper surfaces (front surface side) of the interconnects 53 and interlayer insulating film 63. Since the upper surfaces of the uppermost interconnects 53 and interlayer insulating film 63 are flat as described above, the support substrate 18 is brought into tight contact with the interconnects 53 and interlayer insulating film 63.

Figure 9:
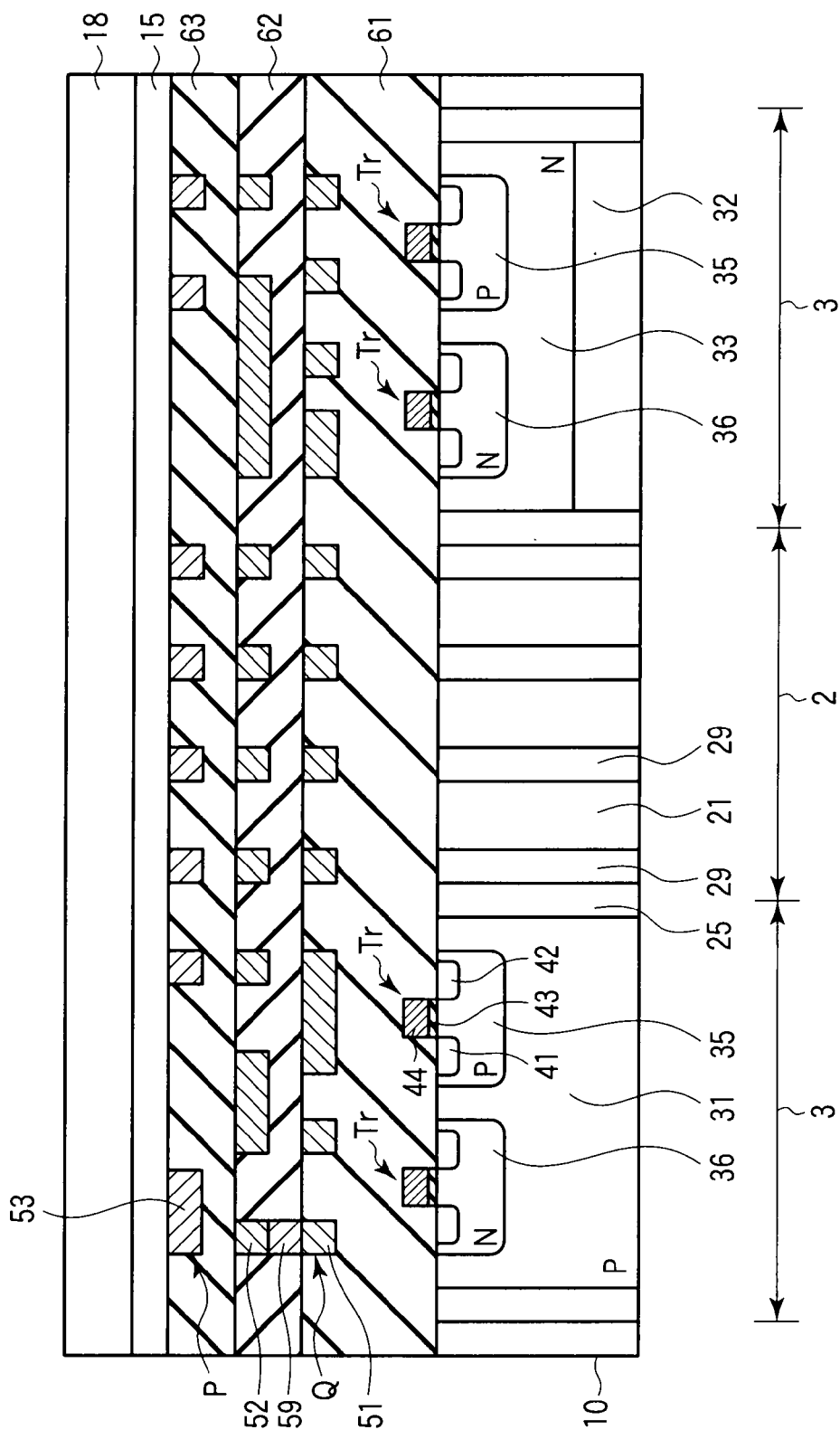
FIG. 9 is a sectional view showing still another step of the method of manufacturing the solid-state image sensor of the first embodiment.

As shown in FIG. 9, the insulating layer and semiconductor substrate forming the SOI substrate are removed from the epitaxial layer 10 by using, e.g., CMP.

As shown in FIG. 2, a protective layer and an adhesion layer 19 are formed on the back surface (first surface) of the epitaxial layer 1, which is opposite to the front surface on which the support substrate 18 is formed. Color filters 70 having a predetermined array pattern are attached on the pixel region 2 by using the adhesion layer 19. In addition, a microlens array 71 is attached on the color filters 70 by using an adhesion layer (not shown). Note that the insulating layer forming the SOI substrate may remain as long as the layer has high transmittance.

The image sensor of this embodiment is completed through the steps described above. In the image sensor formed by the above-mentioned steps, an optical signal corresponding to an image signal illuminates, through the microlenses 71 and color filters 70, the photodiodes 21 in the pixel region 2 from the back surface opposite to the front surface on which the interconnects and interlayer insulating films are formed. That is, the image sensor manufactured by using the manufacturing method of this embodiment is a back-illuminated image sensor.

In the manufacturing method of this embodiment as has been explained with reference to FIGS. 2, 3, 4, 5, 6, and 7, the uppermost interconnects 53 of the back-illuminated image sensor are formed in the uppermost interlayer insulating film by using the damascene method.

The uppermost interconnects 53 are buried by self-alignment in the trenches P formed in the uppermost interlayer insulating film 63. Accordingly, the upper surface level of the interconnects 53 is practically equal to that of the interlayer insulating film 63.

As described above, the interconnects 53 are formed by using the damascene method after the interlayer insulating film is formed. In the manufacturing method of this embodiment, therefore, adjacent interconnects have neither a seam between interlayer insulating films nor a step difference between the upper surfaces of interlayer insulating films.

This improves the flatness of the uppermost interconnects 53 and uppermost interlayer insulating film 63 on which the support substrate 18 is to be attached. Accordingly, the adhesion between the support substrate 18 and the interconnects 53/interlayer insulating film 63 improves, and adhesion defects of the support substrate 18 reduce.

Thus, the method of manufacturing the solid-state image sensor according to the first embodiment can provide a highly reliable solid-state image sensor (back-illuminated image sensor).

(2) Second Embodiment

Figure 10:
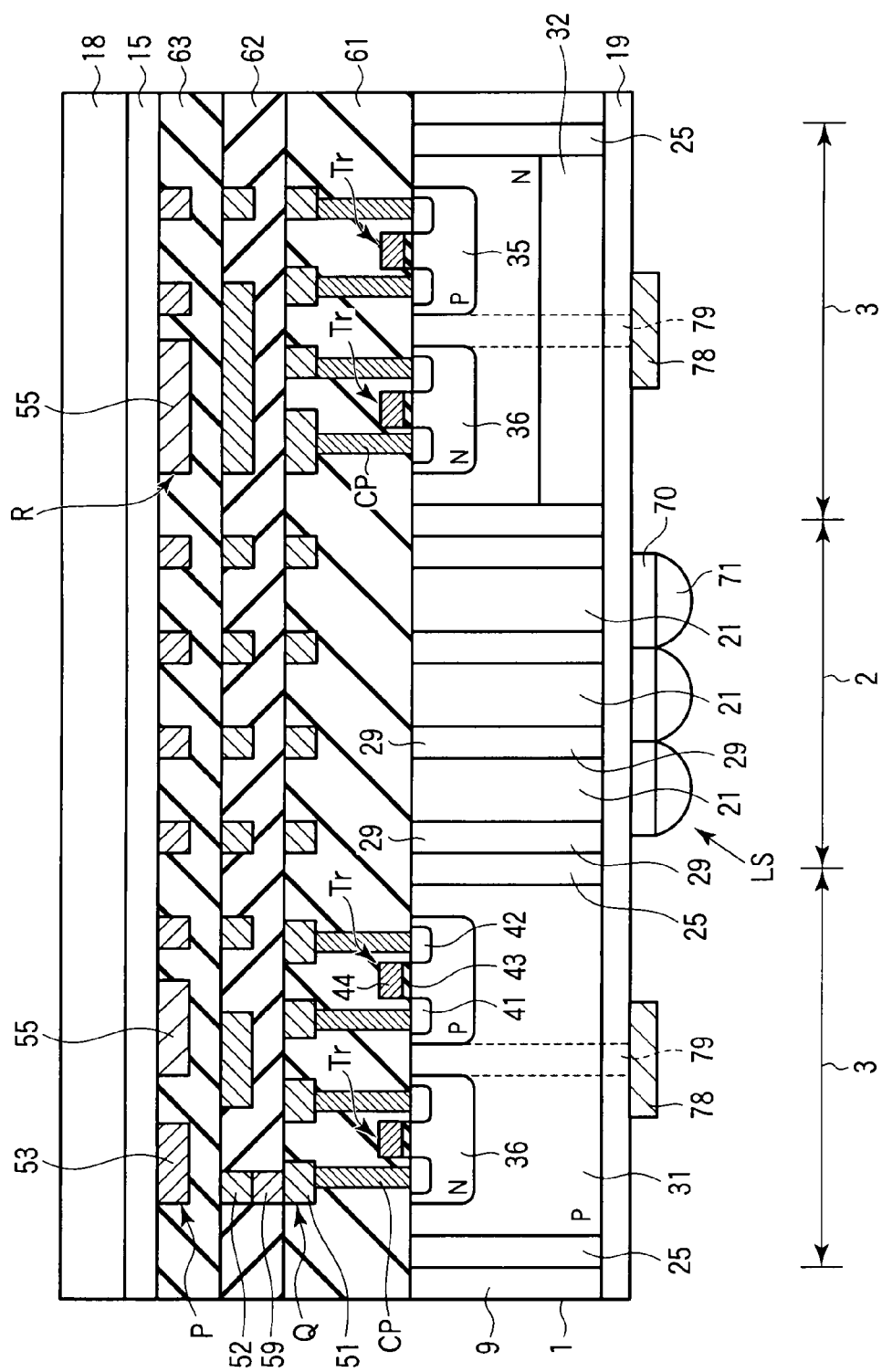
FIG. 10 is a sectional view showing the structure of a solid-state image sensor of the second embodiment.

A solid-state image sensor according to the second embodiment will be explained below with reference to FIG. 10. FIG. 10 shows the sectional structure of the image sensor of this embodiment.

In the image sensor, a pixel OB (Optical Black) region that shields incident light and does not function as a pixel is formed in a pixel region. In a back-illuminated image sensor, a light-shielding pattern for forming the pixel OB (Optical Black) region, which corresponds to the pixel region 2, need not be formed in interlayer insulating films 61, 62, and 63 formed on the front surface (second surface).

Also, in the back-illuminated image sensor of this embodiment, a large-area interconnect pattern (to be referred to as an intermediate interconnect pattern hereinafter) for connecting pads 78 and interconnects 51, 52, and 53 need not be formed on the interlayer insulating film 63 on the front surface side. In the back-illuminated image sensor of this embodiment, for example, the pads 78 are formed on only the surface on which the microlens array 71 is formed, i.e., on only the back surface (first surface) of the image sensor. In this structure, the pads 78 formed on the back surface of a substrate 1 are connected to the interconnects and elements formed on the front surface of the substrate 1 via plugs formed in the interlayer insulating films 61, 62, and 63, heavily doped impurity layers formed in the epitaxial layer 1, and through electrodes 79 extending through the epitaxial layer 1 from the front surface to the back surface.

The through electrodes 79 are formed as follows. For example, after the insulating layer and semiconductor substrate of the SOI substrate are removed in the step shown in FIG. 9, holes extending through the epitaxial layer are formed in positions to be connected to the interconnects. The through electrodes 79 are formed by burying an electrode material in these holes. Referring to FIG. 10, each through electrode 79 is formed at the back or front of the drawing surface, and indicated by the broken lines.

In the back-illuminated image sensor of this embodiment as described above, neither the light-shielding pattern nor the intermediate interconnect pattern need be formed on the front surface. On the front surface of the image sensor, therefore, the flatness of the upper surfaces of the interconnects 53 and interlayer insulating film 63 improves. This improves the adhesion between a support substrate 18 and the interconnects 53/interlayer insulating film 63, and reduces adhesion defects of the support substrate 18. This effect can similarly be obtained by the image sensor of the first embodiment.

Also, in an image sensor having a light-shielding pattern, the area of the light-shielding pattern is generally large, so the existence of the light-shielding pattern interferes with the diffusion of a forming gas when sintering a wafer (chip). Accordingly, the image sensor having the light-shielding pattern reduces the sintering effect on the front surface of the formation substrate 1 on which elements are formed. By contrast, in the image sensor of this embodiment, no light-shielding pattern exists on the front surface of the formation substrate 1. Since this increases the sintering effect, it is possible to reduce a dark current, and stabilize the surface of the element formation region. Consequently, the sensing errors and operation errors of the image sensor reduce, and the operation reliability improves. The same effect can also be obtained by the image sensor of the first embodiment.

Since neither the light-shielding pattern nor the pad pattern exists, however, a region where the area (to be referred to as the coverage hereinafter) occupied by the interconnects with respect to the interlayer insulating film 63 is low sometimes forms in the surface region of the uppermost interlayer insulating film 63 to which the support substrate 18 is to be attached. In this low-coverage region, dishing sometimes occurs because the interlayer insulating film is excessively polished by CMP. This may decrease the flatness of the uppermost interconnects 53 and interlayer insulating film 63.

In this embodiment as shown in FIG. 10, trenches R are formed in the low-coverage regions of the uppermost interlayer insulating film 63, and dummy patterns 55 are buried in the trenches R at the same time the interconnects 53 are formed. The dummy patterns 55 have no function as interconnects for connecting circuits and elements. Like the uppermost interconnects 53, the dummy patterns 55 are formed by using the damascene method, and made of Cu or an alloy of Cu. Note that the dummy patterns 55 can also be formed in the trenches in the interlayer insulating films 61 and 62 below the uppermost interlayer insulating film 63.

The dummy patterns 55 make the coverages in the interlayer insulating film 63 uniform, and suppress the occurrence of dishing on the upper surface of the interlayer insulating film 63.

This reduces the decrease in flatness of the uppermost interconnects 53 and interlayer insulating film 63 resulting from a low coverage, and ensures the adhesion between the uppermost interconnects 53/interlayer insulating film 63 and the support substrate 18. Accordingly, adhesion defects of the support substrate 18 reduce.

As described above, the solid-state image sensor (e.g., the back-illuminated image sensor) according to the second embodiment can improve the reliability of the solid-state image sensor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state image sensor comprising:
   a semiconductor substrate including a first surface on which light enters, and a second surface opposite to the first surface;
   a pixel region formed in the semiconductor substrate, and including a photoelectric conversion element which converts the incident light into an electrical signal;
   a peripheral region formed in the semiconductor substrate, and including a circuit which controls an operation of the element in the pixel region;
   a plurality of interconnects which are formed in a plurality of interlayer insulating films stacked on the second surface, and are connected to the circuit; and
   a support substrate formed on the stacked interlayer insulating films and the interconnects;
   an electrode provided in the semiconductor substrate and extending through the peripheral region from the first surface to the second surface, one end of the electrode connected to a pad on the first surface and an other end of the electrode connected to the circuit on the second surface; and
   at least one of dummy layers formed in the plurality of interlayer insulating films stacked on the second surface, and not connected to the circuit, the dummy layers provided in a low-coverage region in the interlayer insulating films above at least one of the pixel region and a peripheral region,
   wherein an uppermost one of the interconnects formed in an uppermost one of the interlayer insulating films is buried in a first trench formed in the uppermost interlayer insulating film,
   wherein an uppermost one of the dummy layer formed in the uppermost interlayer insulating film is buried in a second trench formed in the uppermost interlayer insulating film, and
   wherein a material used as the uppermost interconnect and the uppermost dummy layer are selected from the group consisting of copper and an alloy of copper.

2. The sensor according to claim 1, wherein an upper surface level of the uppermost interconnect is equal to that of the uppermost interlayer insulating film.

3. The sensor according to claim 1, wherein a material used as another interconnect is selected from the group consisting of copper and an alloy of copper.

4. The sensor according to claim 1, wherein an upper surface level of the dummy layer is equal to that of the uppermost interlayer insulating film.

5. The sensor according to claim 1, wherein a material used as an interconnect except for the uppermost interconnect is selected from the group consisting of aluminum and an alloy of aluminum.

6. The sensor according to claim 1, further comprising a lens formed on the first surface in the pixel region.

7. The sensor according to claim 1, wherein a material used as the pad is selected from the group consisting of aluminum and an alloy of aluminum.

8. The sensor according to claim 1, wherein the dummy layer is provided in the low-coverage region so as to satisfy a predetermined coverage in the uppermost interlayer insulating film.

* * * * *